United States Patent [19]
Farrugia et al.

[11] Patent Number: 5,138,580
[45] Date of Patent: Aug. 11, 1992

[54] METHOD FOR THE ERASURE OF MEMORY CELLS, DEVICE DESIGNED TO IMPLEMENT IT, AND USE OF SAID METHOD IN A DEVICE WITH NON-SUPPLIED MEMORY

[75] Inventors: Augustin Farrugia, La Ciotat; Gérard Binguy, Peynier, both of France

[73] Assignee: Gemplus Card International, Gemenos, France

[21] Appl. No.: 530,230

[22] Filed: May 30, 1990

[30] Foreign Application Priority Data

Jun. 6, 1989 [FR] France .................. 8907467

[51] Int. Cl.⁵ .................. G11C 7/00
[52] U.S. Cl. .................. 365/218; 365/185
[58] Field of Search .................. 365/218, 185

[56] References Cited

U.S. PATENT DOCUMENTS

| | | | |
|---|---|---|---|
| 4,680,736 | 7/1987 | Schrenk | 365/218 |
| 4,758,986 | 7/1988 | Kuo | 365/218 |
| 4,763,305 | 8/1988 | Kuo | 365/218 |

FOREIGN PATENT DOCUMENTS 0123177  10/1984  European Pat. Off. .

OTHER PUBLICATIONS

Patent Abstracts of Japan vol. 2 No. 65 p. E 78 May 18, 1978.
Patent Abstracts of Japan vol. 7 No. 42 (P-177) [1187] Feb. 19, 1983.

*Primary Examiner*—Joseph A. Popek
*Attorney, Agent, or Firm*—Roland Plottel

[57] ABSTRACT

A method for erasure of EEPROM memory cells consists, at the start of each erasure operation, in opening a counter in a RAM memory, carrying out a cycle of erasure as stipulated by the manufacturer, and then a cycle for reading and for comparing the voltage read with an expected voltage corresponding to the "erased" state of the memory cell. Then, if the voltage read is not the expected voltage, in incrementing the counter and ordering a new cycle of erasure, reading and comparison. When the voltage read is the expected voltage, a return code characteristic of the content of the counter and, hence, of the number of erasure cycles that have been necessary for the erasure operation, is transmitted to the user. The method can be applied, notably, to EEPROM memory devices used chip cards.

8 Claims, 2 Drawing Sheets

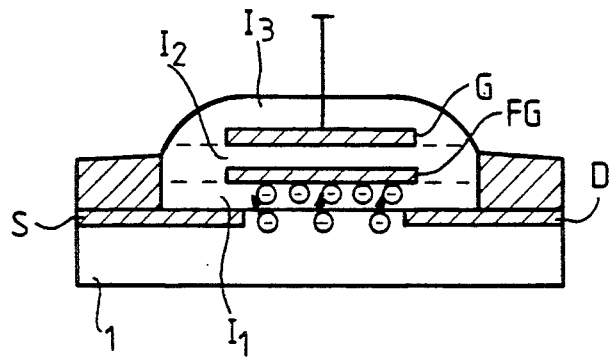
FIG_1
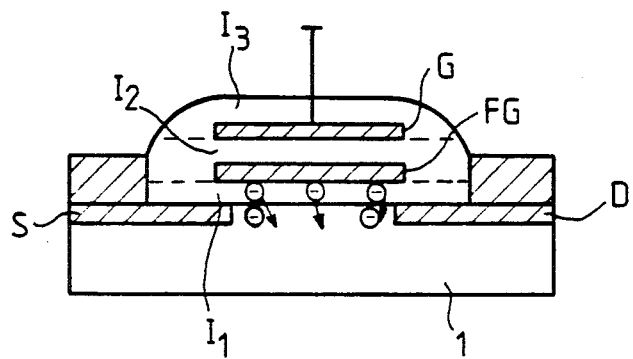
FIG_2
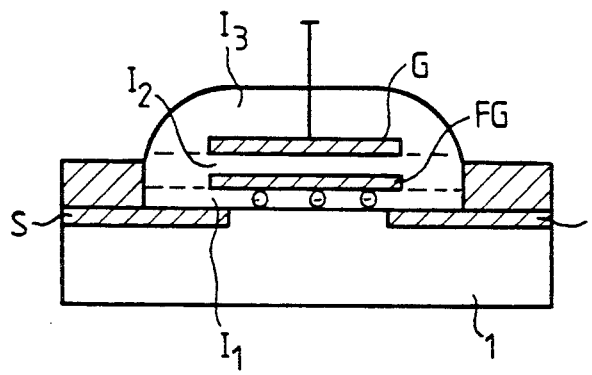
FIG_3
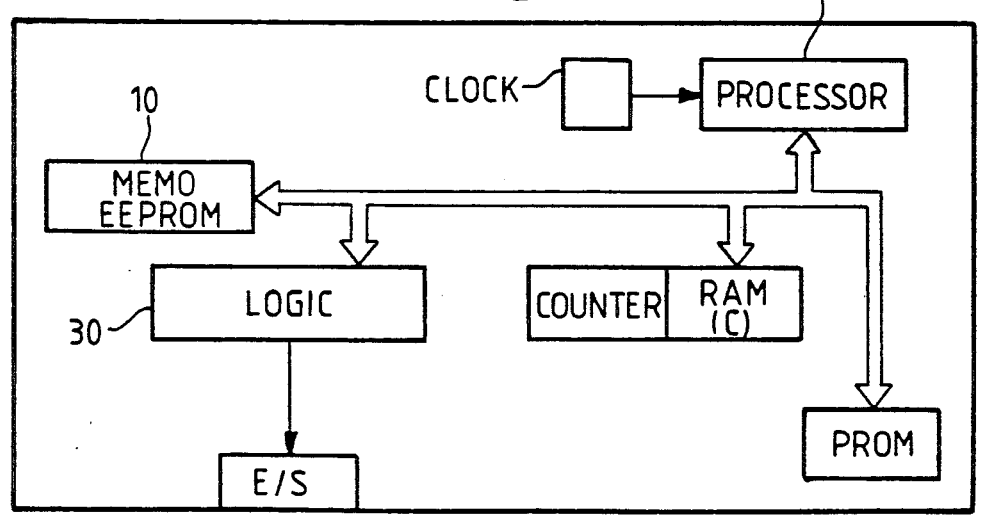
FIG_5

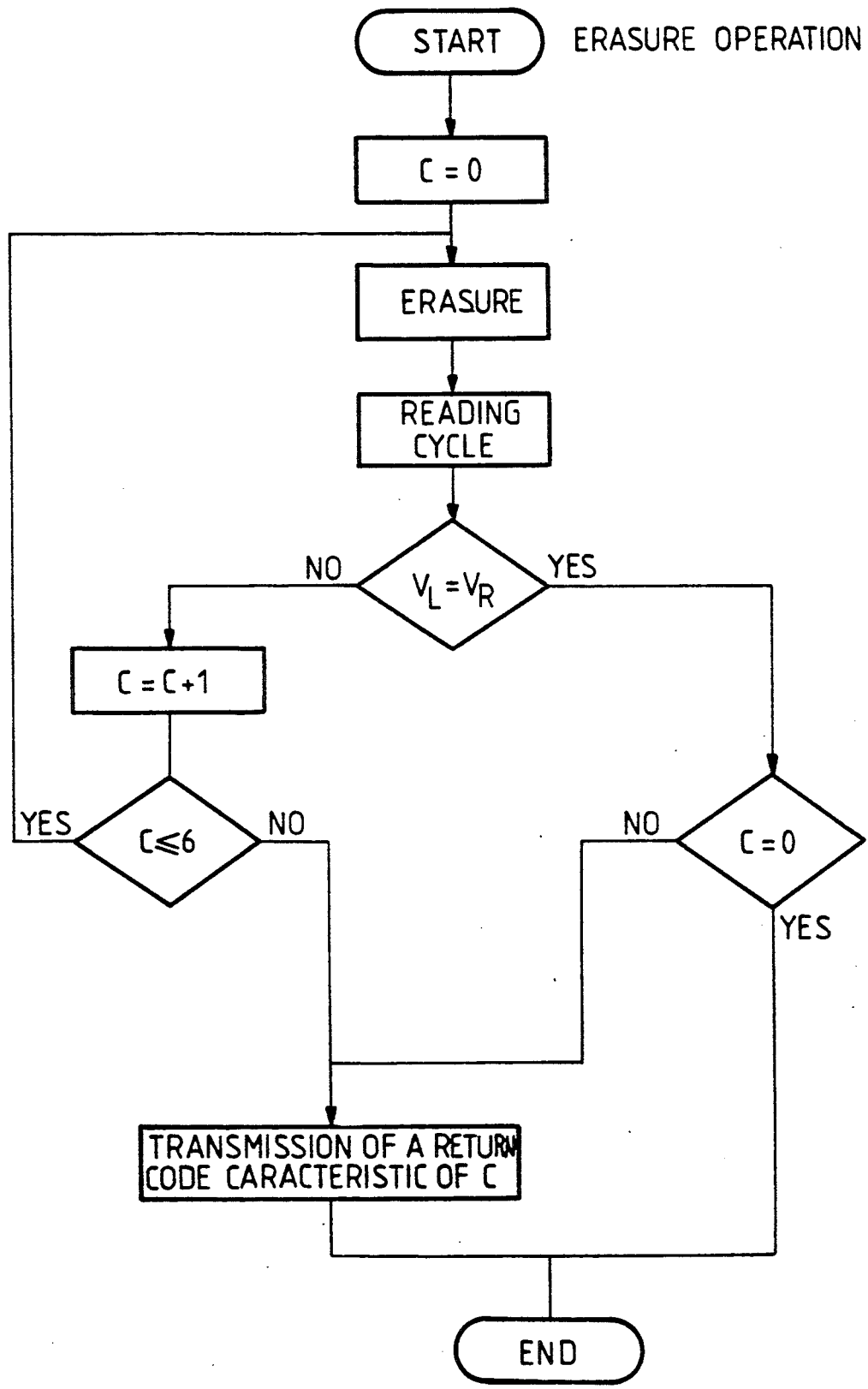

METHOD FOR THE ERASURE OF MEMORY CELLS, DEVICE DESIGNED TO IMPLEMENT IT, AND USE OF SAID METHOD IN A DEVICE WITH NON-SUPPLIED MEMORY

BACKGROUND OF THE INVENTION

1. Field of the Invention

The invention pertains to integrated circuits with memory, more particularly, to electrically erasable programmable memories, and notably to their erasure.

An electrically erasable and programmable memory (or EEPROM) is a read-only memory, namely a memory that preserves the items of memory stored therein, even when power is no longer supplied. Such a memory also has the particular feature of being erasable, byte by byte, for example, by means of an electrical pulse. The terms "programming" and "erasure" will be used hereafter in accordance with a convention commonly used for EEPROM products.

As explained below, the electrical programming and erasure is obtained by the extraction of charges from the substrate and their storage beneath a floating gate, and the return of these same charges to the substrate by tunnel effect. However, explained in greater detail, this phenomenon is not an everlasting one: after a certain number of programming or writing and erasing cycles, the cell, namely the basic memory element, gradually deteriorates so it no longer properly carries out the writing or erasing functions.

2. Description of the Prior Art

Up till now, in the applications using EEPROM components subjected to frequent updating operations, faults have been observed after an unknown and variable number of uses. When this type of problem occurs, during use of the EEPROM, there may be major problems with the larger device or system in which the EEPROM is used. To check the exactness of the items of information modified after a writing or erasing cycle, it becomes necessary for the application to include a systematic re-reading operation. Should the re-reading operation, after a writing operation, highlight an anomaly, the programming or writing is repeated or rewritten, and this rewriting is done until the re-reading is accurate. In a known procedure, the pieces of information to be recorded are rewritten a certain number of times. This number depends on the technology of the memory. There is a similar problem for the erasure: the erasure may have to be reiterated. The only thing is that, for the erasure, the number of operations changes over time or with the use of the memory.

To obtain conditions of operation that are always appropriate, it might be possible to envisage counting the number of erasure/reading cycles in a counter and carrying out a verification in declaring the EEPROM to be out of operation once this number goes beyond a pre-determined threshold which, in this case, would have to be low enough to prevent any risk of malfunctioning. However, since these memories are generally found to be in contexts where they are not supplied with power, example (in chip cards, portable machines, configuration fall-back systems etc.) this counter would have to be housed in the EEPROM memory itself, which would then be overtaxed in comparison to what is being counted. This counter, made by means of the same technology as the memory cells, is naturally subject to the same failures.

Furthermore, it is unfortunately impossible to determine in advance the critical number of cycles beyond which an EEPROM memory is defective: this number varies from one fabrication technology to another, from one product to another within one and the same fabrication technology, from one component to another within one product according to parameters that may be known but often cannot be controlled, such as the temperature, time or programming voltage, etc.

However, experience has shown that the behavior of the cells subsequent to faults is always substantially the same.

SUMMARY OF THE INVENTION

An object of the invention is a method for the erasure of memory cells that takes these faults into acount, firstly in order to obtain the desired erasure in all possible instances and, secondly, to provide warning to the application using the memory cell about the faults encountered in the erasure cycles.

According to an aspect the invention, there is implemented a method for the erasure of EEPROM memory cells, the method including:

opening and initializing a counter in a random-access memory associated with the erasure control processor at the start of each operation for erasing a memory cell;

carrying out an erasure cycle, then a reading cycle and a comparison of the voltage read with an expected voltage corresponding to the erased state;

when the two voltages are different, triggering the iteration of the counter and a new erasure and reading cycle, then a comparison for as long as the content of the counter remains smaller than a pre-determined number, ordering the transmission of a return code towards the application as a function of the content of the counter, and hence of the number of erasure cycles needed for the erasure operation, when the voltage read is the voltage expected after at least two erasure cycles, as well as when the content of the counter has reached the pre-determined number.

Another object of the invention is the device designed for the implementation of this method of erasure.

Another object of the invention is the use of this method of erasure of memory cells in non-volatile memory devices.

BRIEF DESCRIPTION OF THE DRAWINGS

The invention will be understood more clearly, and other characteristics will appear from the following description, with reference to the appended drawings.

FIG. 1 is a drawing of a MOS memory cell in writing phase;

FIG. 2 is a drawing of a MOS memory cell in erasure phase;

FIG. 3 is a drawing of a MOS memory cell in which there is an erasure fault;

FIG. 4 is a flow chart of the EEPROM memory cell erasure method according to the invention;

FIG. 5 is a drawing of the device designed for the implementation of the method of erasure, according to the invention.

DETAILED DESCRIPTION OF THE INVENTION

FIGS. 1, 2 and 3 show the same basic structure of the memory cell in a sectional view, namely the semiconductor substrate 1, the source electrode S and the drain electrode D separated by a channel in the substrate. This unit is covered with insulator oxide, $I_1$ a gate called a floating gate FG because it is unconnected, separated from a control gate G by another oxide layer $I_2$, the gate G being covered with oxide insulator $I_3$. In the writing phase, in FIG. 1, a high amplitude pulse applied to the control gate G makes it possible, for example, to extract the electrons from the substrate and store them beneath the floating gate FG. These electrons go through the insulator barrier which separates them from the floating gate by a tunnel effect on the drain.

In the erasure phase shown in FIG. 2, by the application of a pulse to the control gate G in the opposite direction, the charges stored beneath the floating gate FG return to the substrate, again by tunnel effect. The memory cell is in a stable state after a writing phase, the charges being trapped beneath the floating gate FG and, after the erasure, being brought back to the substrate. However, owing to the ageing caused by a large number of erasure and writing cycles, electron traps get created in the layer of insulator oxide $I_1$ between the substrate and the floating gate, and during the erasure, electrons remain trapped. This is what is shown in FIG. 3. Then, because charges have remained in the insulator, the cell tends to be seen as being still programmed whereas it has actually been erased. The effect of this is to increase the threshold voltage of the transistor.

As indicated above, the number of operation cycles that is the starting point for the occurrence of faults of this kind is generally high, and trials have shown that the behavior of these cells following faults of this type is always the same:

the malfunctions occur systematically during erasure operations in the EEPROM direction, namely during the return of the charges towards the substrate, the malfunctions detected during successive reading/erasure cycles in one and the same cell are not immediately destructive.

When a re-reading operation following an erasure shows that this erasure has not produced the anticipated effect, experience shows that it is enough to generate a second erasure to achieve this effect. Moreover, this phenomenon is reproducible a great many times, i.e. when a cell has a first malfunction, its erasure will subsequently and systematically necessitate two erasure cycles to obtain an accurate erasure.

As and when the memory cell is subjected to operation, these erasure malfunctions become increasingly frequent so that, after a stage with two erasures, it becomes necessary to carry out erasures in three cycles to obtain the desired result. Here again it is possible to have a great number of cycles with three erasures before it becomes necessary to have cycles with four erasures, etc. The method according to the invention for the erasure of memory cells uses these characteristics to optimize the working of the memory cell in erasure and to simultaneously give, to the exterior, a characteristic piece of information at each instant of operation.

FIG. 4 illustrates the method of erasure according to the invention. As indicated above, the faults are generated during the erasure. As a consequence, each erasure operation begins routinely with a normal erasure cycle such as is stipulated in the characteristics of the product, followed by a reading cycle, a counter in the processor of the application being open for this memory cell at the value $C=0$ at the start of each erasure operation. When the voltage read $V_L$ is equal to the expected reference voltage $V_R$, a test on the value of C makes it possible to ascertain, when $C=0$, that no prior erasure has taken place for this cell in the erasure operation, and the erasure is considered to be right.

If, on the contrary, the voltage read $V_L$ is different from the expected voltage $V_R$, then the content of the counter open in the processor of the application is incremented: $C=C+1$. The value of C is then compared with a maximum possible number of erasures, i.e. six for example, beyond which the cell is considered to be definitively unerasable. As long as the content of the counter is smaller than or equal to six, a new erasure and reading cycle is triggered for this very same memory cell. After the second erasure cycle or possibly the third or fourth one, the voltage read being equal to the reference voltage, the check on the value of C shows that C is different from zero, i.e. that several erasure cycles were necessary to obtain the correct reference voltage, and the transmission of a return code is triggered. This return code is sent to the application using the processor, and is characteristic of the number of erasures necessary to obtain the reference voltage characteristic of an accurate erasure. The erasure is then considered to be properly done.

If the content of the counter opened in the processor of the application shows that, for this operation of erasure, the number of cycles needed to achieve the limit value, six in the example indicated above, the erasure is not done and the processor triggers the transmission of a return code characteristic of this counter value, indicating that it was not possible to erase the memory cell.

The erasure operation is then over although the value of the voltage obtained is incorrect.

An additional erasure, called a safeguard erasure, may be provided when several erasure cycles have been necessary to erase a memory cell.

The transmission of a return code characteristic of the number of erasure cycles that were needed to obtain an accurate erasure, makes it possible to give the user an indication of the degree of urgency with which the memory must be replaced. Thus, according to the invention, the method of erasing memory cells consists not in modifying the erasure cycle proper as designed by the manufacturer but in repeating it as many times as is necessary until the erasure operation is effectively performed, by updating, at each new erasure cycle ordered, the content of a counter opened to this end during the use of the product, either in the processor of the product itself, for example in the processor of the microcircuit card, or in the processor of the application, at the start of the erasure operation. A very simple logic circuit using the content of this counter enables the generation of a return signal as a function of the state of the memory cell, at the instant of the operation of the erasure that has just been performed.

FIG. 5 illustrates the device designed for the implementing of the erasure method as described above.

The EEPROM 10, formed by a set of erasable memory cells such as those described above, is not supplied with power except during working phases for the application. When working and/or during its recording or its erasure, the memory 10 is connected to a microprocessor circuit, which is that of the application. This circuit has a processor 20 which manages the memory 10, a microcircuit card for example, with its clock H, its associated random-access memories, RAM data and other instructions recorded in PROM memory and the input/output circuits E/S. The generation of the return codes is triggered by the processor which controls the counting state of the counter in the RAM. The state of this counter may change frequently, from one cell to the other, since its technology enables it to do so.

The processor also controls return code generating logic 30, as a function of the state of the counter in the RAM. The logic 30 may be borne by the memory device itself as shown in FIG. 5. Rather than delivering only one message, the failure of the erasure at the end of six attempts for example, the return codes may correspond to increasingly urgent warnings as and when the counter of the RAM is incremented. The number of the messages as well as their content informs the user of subsequent precautions to be taken with the memory thus monitored.

What is claimed is:

1. A method for the erasure of EEPROM memory cells contained in a memory, said method consisting in:

opening and initializing a counter in a random-access memory associated with an erasure control processor at the start of an operation for erasing a memory cell of said memory; said operation for erasing comprising erasure cycles, carrying out an erasure cycle on said memory cell, then a reading cycle for reading an actual status voltage of said memory cell and a comparison of the voltage read with an expected voltage corresponding to an erased state of said memory cell;

when said read and expected voltages are different, triggering the iteration of the counter and a new erasure and reading cycle, then a comparison, for as long as the content of the counter remains smaller than a predetermined number, said predetermined number being greater than one;

ordering the transmission of a return code towards an output of the memory as a function of the content of the counter, and hence of the number of erasure cycles needed for the erasure operation, when the voltage read is the voltage expected after at least two erasure cycles, as well as when the content of the counter has reached the predetermined number.

2. A method according to claim 1, wherein an additional erasure cycle, namely a safeguard erasure cycle, is ordered before the transmission of the return code when the voltage read is the expected voltage and when the content of the cycle is different from zero, several erasure cycles having been necessary to obtain the expected voltage.

3. A device comprising a memory constituted by EEPROM type memory cells associated with a processor, means for opening at the start of each operation of erasure a counter in a random-access memory (RAM) of the processor, and logic means for selectively triggering a return code as a function of the state of the counter at the end of the erasure operation, said selective triggering means including means for counting contents of the counter, and said counter including means for counting a number of erasure cycles in excess of one needed for an erasure operation, as well as when the contents of the counter has reached a predetermined number.

4. A method of erasure according to one of the claims 1 or 2, wherein said EEPROM memory cells are not supplied except during a reading, writing and interrogation of said memory.

5. A method of erasure according to claim 4 wherein said memory is mounted in a microcircuit card.

6. A method for erasure of EEPROM memory cells, said method comprising the steps of (a) initializing a counter in a random-access memory associated with an erasure control processor at the start of an operation for erasing a memory cell;

(b) carrying out an erasure cycle of said memory cell, (c) then carrying out a reading cycle of said memory cell, and (d) comparing a voltage read with an expected voltage corresponding to an erased state of said memory cell;

(e) when said read and said expected voltages are different, triggering an iteration of the counter, and carrying out a new erasure, reading cycle, and comparison and repeating said step (e) for as long as the content of the counter remains smaller than a predetermined whole number which is greater than two, and, (f) generating a return code as a function of the content of the counter, and hence of the number of erasure cycles needed for the erasure operation, when the voltage read is the voltage expected after at least two erasure cycles, as well as when the content of the counter has reached the predetermined number.

7. A method according to claim 6, wherein an additional erasure cycle, namely a safeguard erasure cycle, is ordered before the transmission of the return code when the voltage read is the expected voltage and when the content of the cycle is different from zero, several erasure cycles having been necessary to obtain the expected voltage.

8. A device, comprising a processor having RAM, a memory constituted by EEPROM type memory cells associated with said processor means for opening a counter at the start of each operation of erasure in said of the processor, and logic means for triggering a return code as a function of the state of the counter at the end of the erasure operation, further comprising means for incrementing the contents of said counter in accordance with a number of erasure cycles in excess of two needed for an erasure operation of a memory cell.

* * * * *